(12) United States Patent
Marvasti

(10) Patent No.: US 6,601,206 B1
(45) Date of Patent: Jul. 29, 2003

(54) ERROR CONCEALMENT OR CORRECTION OF SPEECH, IMAGE AND VIDEO SIGNALS

(75) Inventor: Farokh Alim Marvasti, Northwood Hills (GB)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/447,026

(22) Filed: Nov. 22, 1999

(30) Foreign Application Priority Data

Dec. 4, 1998 (EP) ............................. 98309935

(51) Int. Cl.⁷ ...................... H03M 13/47; H03M 13/01; G10L 19/02
(52) U.S. Cl. ........................ 714/746; 708/404
(58) Field of Search ................. 708/403–409; 714/746, 752, 761, 776

(56) References Cited

U.S. PATENT DOCUMENTS 3,605,019 A * 9/1971 Cutter et al. ................. 370/210
6,404,817 B1 * 6/2002 Saha et al. ............. 375/240.27

FOREIGN PATENT DOCUMENTS

| EP | 1006665 A1 * | 6/2000 | .......... H03M/13/00 |
| FR | 2 753 592 | 9/1996 | .......... H04L/27/06 |
| JP | 57067347 A * | 4/1982 | ............ H04L/1/00 |

OTHER PUBLICATIONS

Farokh Marvasti et al, "Sampling Theorem: A Unified Outlook On Information Theory, Block and Convolutional Codes", IEICE Transactions on Fundamentals of Electronics, Communications and Computer Sciences, vol. 76A, No. 9, Sep. 1, 1993, pp. 1383–1391, Tokyo.
European Search Report, 98309935,9–2209–, May 14, 1999.

* cited by examiner

*Primary Examiner*—R. Stephen Dildine

(57) ABSTRACT

A method of error concealment or correction, suitable for signals such as speech, image and video signals, and particularly for such signals as transmitted over wireless and ATM channels. The method has improved stability for large block sizes and bunched errors. It is based on a modification of the discrete Fourier transform which is equivalent to a permutation of the Fourier coefficients. Thus, as with the conventional Fourier transform, setting a contiguous set of coefficients equal to zero in the transmitted signal enables error concealment techniques to be used at the receiver. However, with the modified transform, the zeroes are not bunched together in the spectrum, so the instability problems that arise when the conventional Fourier transform is used are mollified, and much larger block sizes can be used.

25 Claims, 3 Drawing Sheets

ERROR CONCEALMENT OR CORRECTION OF SPEECH, IMAGE AND VIDEO SIGNALS

CROSS-REFERENCE TO RELATED APPLICATION

This application claims priority of European Patent Application No. 98309935.9, which was filed on Dec. 4, 1998.

FIELD OF THE INVENTION

This invention relates to methods of and apparatus for error concealment or error correction of signals such as speech, image and video signals, and particularly for such signals as transmitted over wireless and ATM channels.

BACKGROUND OF THE INVENTION

In Marvasti and Nafie, "Sampling Theorem: A Unified Outlook on Information Theory, Block and Convolutional Codes", IEICE Trans. Fundamentals, vol E76-A, no. 9, September 1993 (hereinafter referred to as "ST") and Marvasti, Hasan and Echhart, "Speech Recovery with Bursty Losses", Proc of ISCAS '98, Monterey, Calif., USA, May 31–Jun. 3, 1998 (hereinafter referred to as "BL") there is disclosed a technique for error concealment or correction of an analogue signal using the discrete Fourier transform (DFT). The signal is sampled and formed into blocks and the DFT is taken. Then the DFT is modified so that M consecutive components are equal to zero (bearing in mind the cyclic nature of the coefficients in a DFT, so that for a block length of N the Nth coefficient and the first are consecutive). For error correction, these components are inserted into the DFT spectrum, so that the block size is greater than the original number of samples, whereas for error concealment, M components of the DFT are set to zero, so that some information in the signal is lost. Then the inverse Fourier transform is taken and the resulting new signal is transmitted, after the usual frame processing. As pointed out in ST, the positions of the zero-value components can be, and preferably are, selected so that the inverse DFT gives a signal with real values, assuming that the original signal has real values. In ST it is shown that it is possible to correct up to M erasures per block, and some methods for doing so are described. If the block length of the transmitted signal is N and the number of coefficients set to zero is M and N=K+M, possible methods involve inverting a K×K matrix, and interpolating the missing values using Lagrange interpolation. Both of these methods become computationally intensive for large N, and BL discloses a recursive method which is much more tractable. Unfortunately, as is pointed out in BL, rounding errors accumulate when the block size becomes large, especially when the erasures that are being corrected appear in consecutive samples, and it has been found that the recovery methods become unstable for block sizes greater than N=64.

To comply with telecommunications standards such as the G.729 or GSM standards, samples need to be transmitted in frames of a certain size, which is 80 samples in the case of G.729 and 160 samples in the case of GSM. Since transmission errors causing erasures cause whole frames to be dropped, the block length must be a multiple of the frame length. In other words, block lengths must be greatly in excess of N=64. Furthermore, loss of a frame means loss of 80 or 160 consecutive samples, so the stability of the error recovery method is under considerable pressure.

It is an object of the present invention to provide a technique for error concealment or error correction which has improved stability for large block sizes.

SUMMARY OF THE INVENTION

The invention is based on the discovery of a modified form of discrete Fourier transform which is formally similar to the normal DFT in that the same recovery, methods can be used as in ST and BL, but which does not suffer from the instability to the same degree. Furthermore, when actually performing the transform and the inverse transform, the conventional FFT method can be used, enabling much existing hardware and software to be employed in the modified technique.

More specifically, the method of the present invention comprises a method (and apparatus) for introducing increased redundancy into a discrete signal for the purpose of error concealment or correction of bursty and/or frame losses, the method comprising the steps of forming the discrete Fourier transform of a block of samples of said signal; modifying the Fourier transform to form a block of coefficients of block length N in which a predetermined set of M Fourier coefficients are equal to zero; and forming the inverse discrete Fourier transform of the block of Fourier coefficients to form the increased-redundancy signal. More particularly, the predetermined set of Fourier coefficients consists of the coefficients numbered p(k) where k takes on M successive integer values, p(k) being defined as p(k)=pk mod N where p is a positive integer, greater than unity, relatively prime to N.

The present invention also comprises a method (and apparatus) for providing error concealment or correction of a sampled analog signal in which a signal is recovered from a received signal in which some samples have not been correctly received by using redundancy introduced into the transmitted signal, the redundancy consisting of a predetermined set of M Fourier components in each block of the discrete Fourier transform of the transmitted signal of block length N being equal to zero. Again, the predetermined set of Fourier coefficients consists of the coefficients numbered p(k) where k takes on M successive integer values, p(k) being defined as p(k)=pk mod N where p is a positive integer, greater than unity, relatively prime to N.

BRIEF DESCRIPTION OF THE DRAWINGS

Embodiments of the invention will now be described by way of example with reference to the accompanying drawings, in which.

DETAILED DESCRIPTION

Error Recovery Using the DFT

Figure 1:
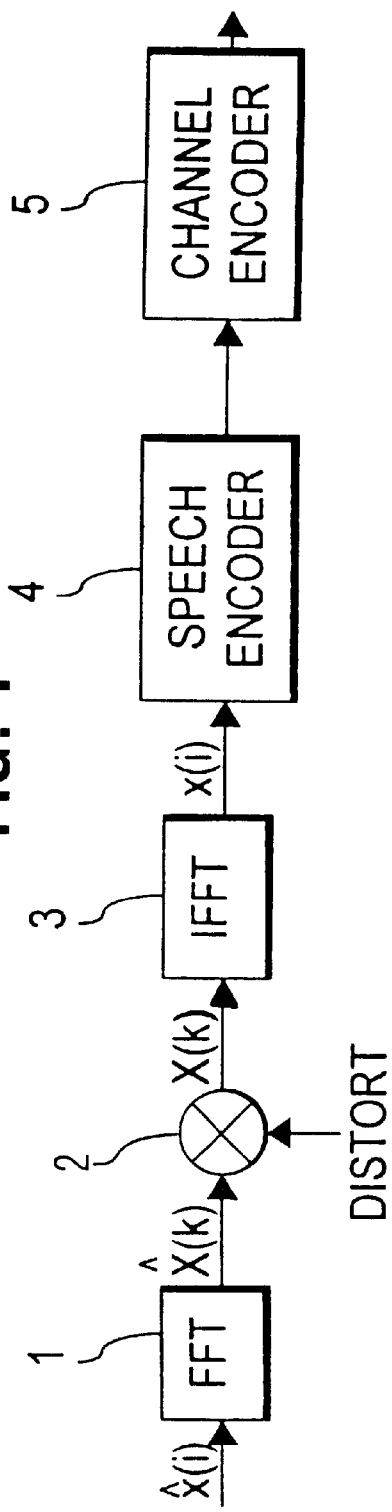
FIG. 1 shows in diagrammatic form transmission apparatus embodying the invention.

To understand the modified DFT and the modified error recovery technique, it will first be useful to remind ourselves of the conventional DFT and the error recovery technique disclosed in BL.

If $x(i)(i=0 \ldots N-1)$ is a series of N samples, the DFT $X(k)$ is defined by $$X(k) = \frac{1}{\sqrt{N}} \sum_{i=0}^{N-1} x(i) \exp\left(\frac{2\pi jki}{N}\right)$$

where j is the square root of −1. For reasons which will become apparent later we rewrite this as $$X(k) = \frac{1}{\sqrt{N}} \sum_{i=0}^{N-1} x(i) \exp(jkiq)$$

where $$q = \frac{2\pi}{N}.$$

The inverse transformation is $$x(i) = \frac{1}{\sqrt{N}} \sum_{k=0}^{N-1} X(k) \exp(-jikq).$$

In the known error concealment technique, we originally have a series of samples $\hat{x}(i)$ and we form the DFT $\hat{X}(k)$. We then set M consecutive ones of the DFT coefficients equal to zero to form a new DFT $X(k)$ such that $X(k)=\hat{X}(k)$ for $k \notin \mu$ and $X(k)=0$ for $k \in \mu$, where $\mu$ is the set of coefficients set to zero. Then we form the inverse DFT $x(i)$ which is a filtered version of $\hat{x}(i)$. In fact, if we choose $\mu$ so that the coefficients set to zero correspond to the highest frequency components, it is a low-pass filtered version. In the case of error correction, we stuff M zeroes into the spectrum instead of setting M coefficients to zero, so no information is lost, but $x(i)$ is not simply a filtered version of $\hat{x}(i)$. In what follows we discuss only the case of error concealment, but the principles can equally be applied to error correction. The signal that is transmitted is $x(i)$, which contains redundancy, since it is known a priori that the M components of $X(k)$ corresponding to values of k that are in $\mu$ are equal to zero.

Now we assume that the received signal $d(i)$ is equal to $x(i)$ except for a set of samples $x(i_m)$ which are known to have been incorrectly received and which are therefore discarded. We wish to use the redundancy in $x(i)$ to interpolate the missing samples and recover $x(i)$. We write the number of discarded samples as $s\tau$ where s is the frame length used for transmission and $\tau$ is the number of discarded frames. The missing samples can be recovered if $s\tau$ is less than or equal to M. We define the error $e(i)=x(i)-d(i)$ and its DFT $E(k)$. Note that $e(i)=0$ for $i \in \{i_m\}$ and $e(i_m)=x(i_m)$ for all $i_m$.

Knowing the positions $i_m$ of the missing samples, we can construct a polynomial (the "error locator polynomial") as a product $$H(z) = \prod_{m=1}^{s\tau} (z - z_{i_m}) \tag{1}$$

where $z_i=\exp(jiq)$, and we can rewrite this as a sum $$H(z) = \sum_{t=0}^{s\tau} h_t z^t. \tag{2}$$

In practice, an efficient way of calculating the coefficients $h_t$ is by calculating $H(z)$ using the product form (1) for at least $s\tau+1$ values of z equally spaced on the unit circle and using the FFT algorithm.

Note that $H(Z_{i_m})=0$ for all of the positions of the discarded samples. Therefore, we can multiply $H(Z_{i_m})$ in the form of equation (2) by $e(i_m)z_{i_m}^r$ and sum over m to get $$\sum_{m=1}^{s\tau} e(i_m) \sum_{t=0}^{s\tau} h_t z_{i_m}^{t+r} = 0$$

Reversing the order of summation gives $$\sum_{t=0}^{s\tau} h_t \sum_{m=1}^{s\tau} e(i_m) z_{i_m}^{t+r} = 0,$$

which can be rewritten $$\sum_{t=0}^{s\tau} h_t E(t+r) = 0.$$

This can be rearranged to give $$E(r) = -\frac{1}{h_0} \sum_{t=1}^{s\tau} h_t E(r+t). \tag{3}$$

Thus, given any $s\tau$ consecutive known values of $E(r+t)$ we can calculate another contiguous value and so calculate all the values recursively. But we know that for $k \in \mu$, $X(k)=0$, so $E(k)=-D(k)$. Therefore we have $M \geq s\tau$ consecutive known values to start with and can calculate all the others. Given the DFT of the errors $E(k)$ we can easily calculate the non-zero DFT coefficients of the samples $X(k)=D(k)+E(k)$ and thereby recover the samples $x(i)$.

Other ways of recovering the lost samples include matrix inversion and Lagrange interpolation as discussed in ST, but the method just outlined is the presently preferred one, since it is less computationally intensive.

The problem with the technique described above is that it becomes unstable for large block sizes, and this is believed to be connected with the fact that the set $\mu$ of coefficients set to zero must be contiguous, at least for the above recursive method and the Lagrange interpolation method, and to be certain that the matrix to be inverted is non-singular.

The Inventive Modification

The present invention is based on the observation that the whole of the reasoning set out above, including Fourier's theorem itself, still holds if, instead of defining $$q = \frac{2\pi}{N}$$

we define $$q = \frac{2\pi p}{N}$$

where p and N are mutually prime integers and p>1. The modified DFT is now defined as $$X_p(k) = \frac{1}{\sqrt{N}} \sum_{i=0}^{N-1} x(i) \exp\left(\frac{2\pi j p i}{N}\right).$$

This is equivalent to a permutation of the coefficients, so that $$X_p(k) = X(p(k)) \quad (4)$$

where p(k)≡pk mod N. Thus, when we use the modified transform and set M consecutive coefficients to zero, it is equivalent to using the conventional DFT and setting components p(k) to zero where k takes on M consecutive values. If p is suitably chosen, this has the effect of scattering the zeroes across the spectrum, which makes the recovery process much more stable, even for large block sizes.

Besides the fact that p and N have to be relatively prime, there are two contradictory requirements for the choice of p, the first one is that we need a p such that the decoding is stable. For stability, it is necessary that the error locator polynomial spans the unit circle, i.e., $z_i$ for i∈μ should be spread over the unit circle. In other words, we require pM≧N. On the other hand, filtering in the new transform domain creates some distortion on the original source signal. In order to reduce this distortion, p has to be chosen such that the coefficients set to zero are low energy coefficients. If p is around N/2, almost half of the high frequency coefficients of FFT remain in the high frequency region of the new transform. However, the transform is not very stable (though not as bad as the conventional DFT). Also, we can show that the transform for p=N/2+e is the conjugate of N/2−e for even N. Therefore, a compromise value for p in the range $$\frac{N}{M} \leq p < \frac{N}{2}$$

can be chosen by listening tests. For example, to be able to replace one missing frame where N=480 and s=160, so that M=160 is required, p=197 can be found experimentally to be the best compromise.

In addition to the recursive method, the reasoning in ST which shows that matrix inversion can be carried out (i.e. that the matrix to be inverted is non-singular) and that the x(i) can be recovered by Lagrange interpolation, is still valid with the modified DFT. These methods therefore could be used instead of the recursive method, although they, and particularly matrix inversion, are more computationally intensive and are not preferred.

Transmission Apparatus

FIG. 1 shows a fast Fourier transform (FFT) processor 1 arranged to receive a sampled speech signal $\hat{x}(i)$ in blocks of N samples and to produce Fourier coefficients $\hat{X}(k)$. The output signal from the FFT processor 1 is passed through a distortion processor 2 to inverse FFT processor 3 to produce a filtered signal x(i). The distortion processor sets certain of the coefficients $\hat{X}(k)$ equal to zero. In the known technique described in BL this would be a set of M consecutive coefficients corresponding to high frequency components of the signal, but in the present technique it is the coefficients numbered p(k) where k takes on M consecutive values.

Thus, whereas in the known technique x(i) is a low-pass filtered signal, in the present technique the filtering applied to the signal is more subtle, consisting of a number of narrow frequency notches scattered across the spectrum. The output signal from the inverse FFT processor 3 is then applied to a conventional speech encoder 4 and a conventional channel encoder 5 which arranges the signal into frames for transmission.

Receiving Apparatus

Figure 2:
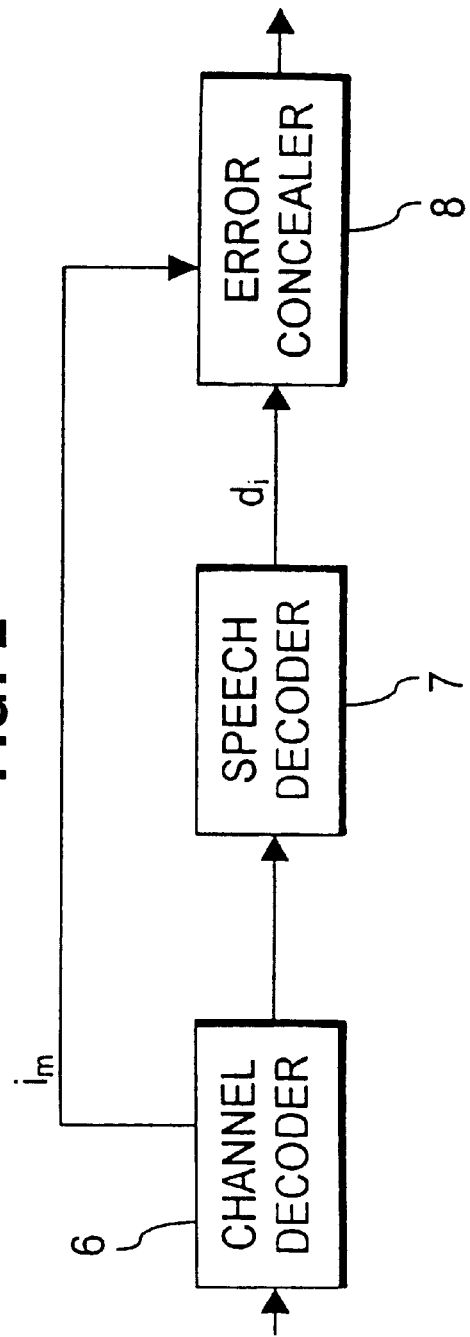
FIG. 2 shows in diagrammatic form receiving apparatus embodying the invention.

FIG. 2 shows a conventional channel decoder 6 arranged to receive the transmitted signal from the apparatus of FIG. 1. The channel decoder 6 undoes the frame structure of the signal and identifies frames $i_m$ that have become corrupted in transmission or not received. The samples corresponding to such frames are set to zero and a signal $i_m$ identifying these lost samples is produced. The output from the channel decoder is passed to a conventional speech decoder which is the counterpart of the speech coder 4 of FIG. 1 and produces the signal d(i) which, if no frames have been corrupted or not received, should be the same as the filtered signal x(i), but otherwise is the filtered signal x(i) with one or more frames-full of samples set to zero. The signal d(i) is passed to an error concealer processor 8 which is also connected to receive the signal $i_m$ identifying the lost samples. The error concealer processor 8 carries out the recursive process to recover the lost samples and reconstruct the filtered signal x(i).

Error Concealer

Figure 3:
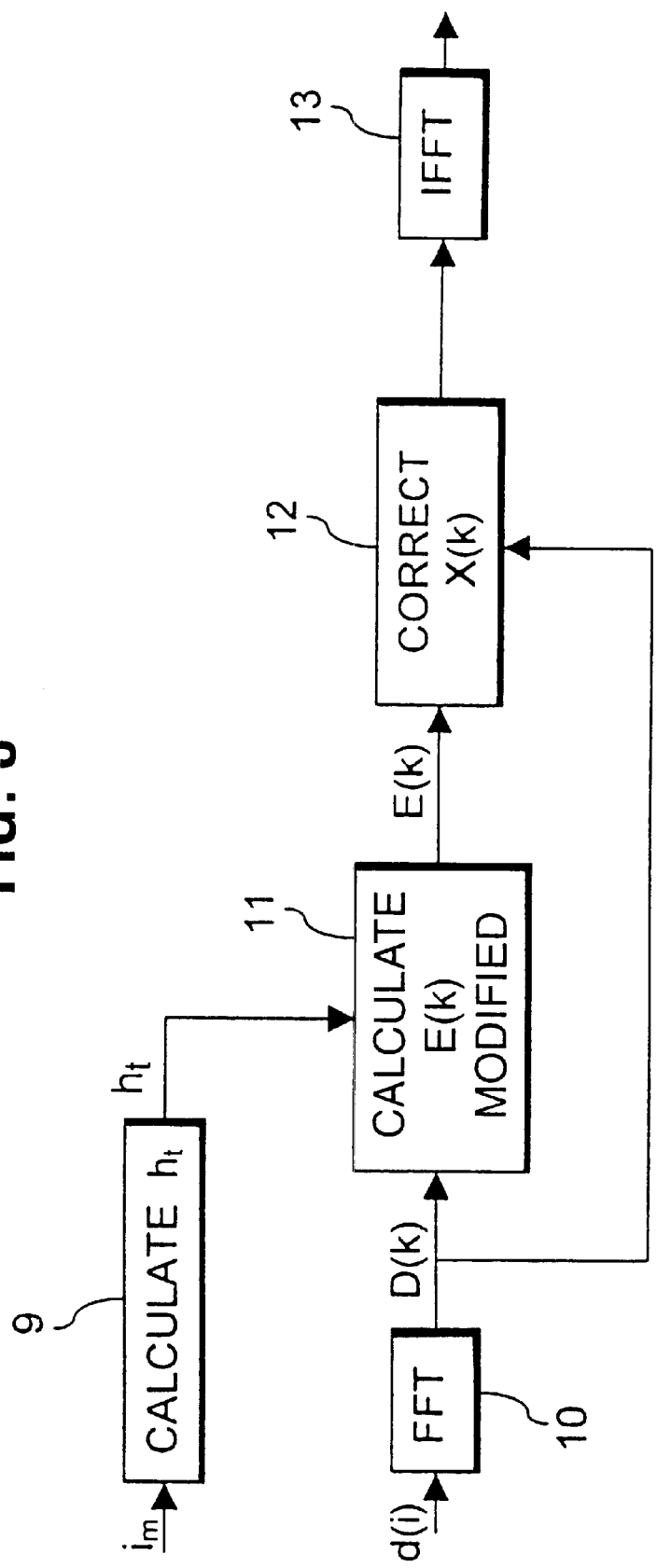
FIG. 3 shows in diagrammatic form one embodiment of the error concealer portion of FIG. 2

FIG. 3 shows in more detail one embodiment of the error concealer processor 8 of FIG. 2.

A coefficient calculator processor 9 is arranged to receive the signal $i_m$ identifying the lost samples from the channel decoder processor 6 of FIG. 2 and to calculate the coefficients $h_t$ of the error locator polynomial H(z) as given by equation (2). It does this by calculating H(z) using equation (1) for a number of values of z equally spaced around the unit circle and calculating the coefficients $h_t$ using an FFT processor. When H(z) is calculated, the values of $z_i$=exp(jiq) need to be calculated using q=2πp/N, so the positions of the zeroes are different in the modified method.

An FFT processor 10 is connected to receive the signal d(i) from the speech coder processor 7 of FIG. 2 and derives the DFT D(k). A modified recursion processor 11 is connected to receive the DFT D(k) from the FFT processor 10 and the coefficients $h_t$ from the coefficient calculator processor 9 and derives the error DFT coefficients E(k) using the modified form of the recurrence relation (3), starting from the values corresponding to the a priori known values of X(p(k))=0 for k∈μ. The modified form of equation (3) reads:

$$E(p(r)) = -\frac{1}{h_0} \sum_{t=1}^{sr} h_t E(p(r+t)).$$

A correction processor 12 is connected to receive the error DFT coefficients E(k) from the coefficient calculator processor 9 and the DFT coefficients D(k) from the FFT processor 10 and adds E(k) and D(k) to calculate the DFT coefficients X(k) of the recovered filtered signal. An inverse FFT processor 13 is connected to receive the DFT coefficients X(k) and calculates the recovered filtered signal x(i).

Figure 4:
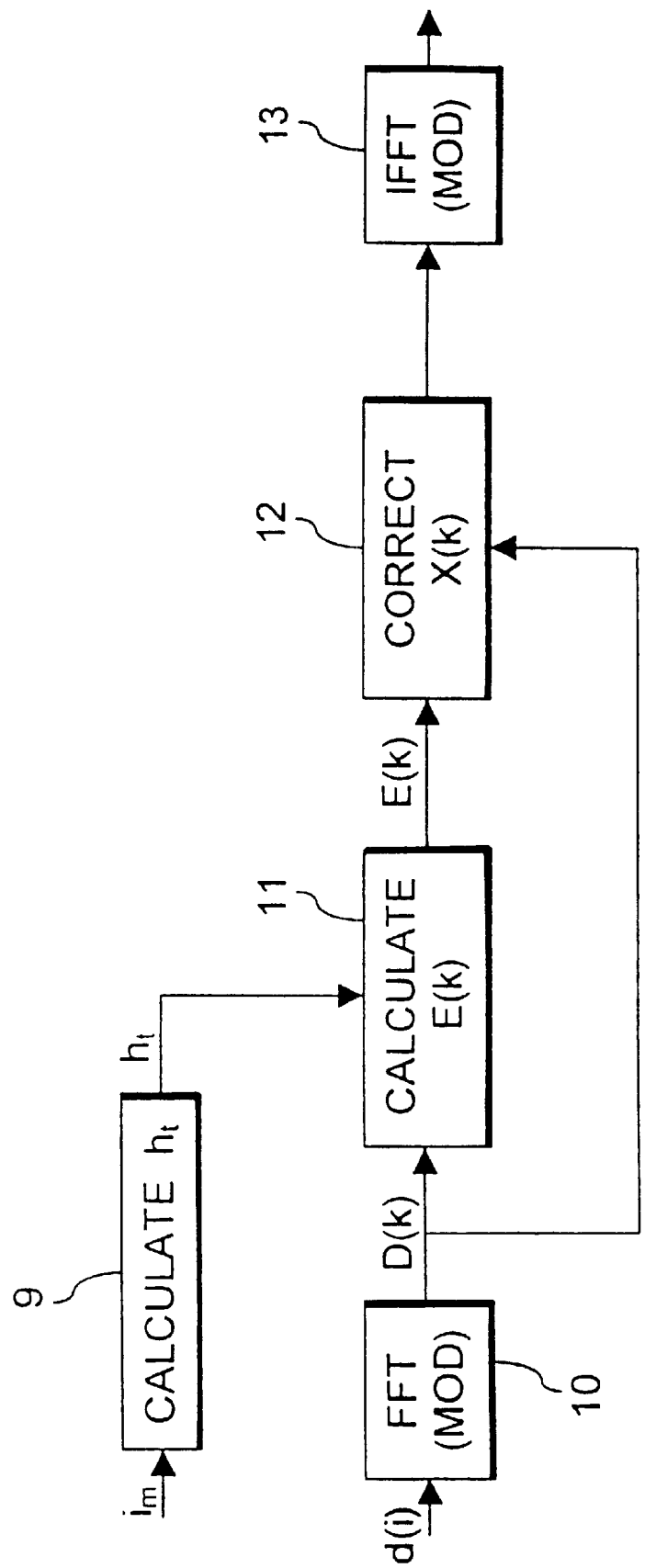
FIG. 4 shows in diagrammatic form another embodiment of the error concealer portion of FIG. 2.

FIG. 4 shows an alternative embodiment of the error concealer processor 8 of FIG. 2. In this case the recursion processor 11 uses the unmodified form of the recurrence relation (3), but the FFT processor 10 and the inverse FFT processor 13 are modified in that the modified FFT processor 10 carries out the normal FFT algorithm followed by a permutation as shown in equation (4) and the modified inverse FFT processor carries out an inverse permutation followed by the normal FFT algorithm.

If we denote the DFT by F, the permutation by P and the recursive step by R, both embodiments carry out the process $F^{-1}P^{-1}RPF$, but the embodiment of FIG. 3 does it in the form $F^{-1}R'F$ where $R'=P^{-1}RP$ and the embodiment of FIG. 4 does it in the form $F'^{-1}RF'$ where $F'=PF$.

IMPLEMENTATION

The processors required for the apparatus described above can be implemented as executable code in association with a microprocessor or signal processor chip or a combination of both.

What is claimed is:

1. A method of introducing increased redundancy into a discrete signal for the purpose of error concealment or correction of bursty and/or frame losses comprising:
   forming the discrete Fourier transform of a block of samples of said signal;
   modifying said Fourier transform to form a block of coefficients of block length N in which a predetermined set of M Fourier coefficients are equal to zero; and
   forming the inverse discrete Fourier transform of said block of Fourier coefficients to form the increased-redundancy signal;
   CHARACTERISED IN THAT
   said predetermined set of Fourier coefficients consists of the coefficients numbered p(k) where k takes on M successive integer values, p(k) being defined as p(k)=pk mod N where p is a positive integer, greater than unity, relatively prime to N.

2. The method as claimed in claim 1 further including transmitting said increased-redundancy signal in frames of s samples, where s is an integer factor of the block length N and M is greater than or equal to s.

3. The method as claimed in claim 2 wherein M is an integer multiple of s.

4. A method of error concealment or correction of a sampled analog signal comprising:
   receiving a signal in which some samples have not been correctly received; and
   recovering a signal from the received signal by using redundancy introduced into the transmitted signal, said redundancy consisting of a predetermined set of M Fourier components in each block of the discrete Fourier transform of the transmitted signal of block length N being equal to zero;
   CHARACTERISED IN THAT
   said predetermined set of Fourier coefficients consists of the coefficients numbered p(k) where k takes on M successive integer values, p(k) being defined as p(k)=pk mod N where p is a positive integer, greater than unity, relatively prime to N.

5. The method as claimed in claim 4 wherein said increased-redundancy signal is received in frames of s samples, where s is an integer factor of the block length N and M is greater than or equal to s.

6. The method as claimed in claim 5 wherein M is an integer multiple of s.

7. The method as claimed in claim 4 comprising:
   forming the discrete Fourier transform D(k) of a block of N samples of the received signal d(i);
   using D(k) to recursively calculate an error signal E(k);
   using the error signal E(k) and the discrete Fourier transform D(k) of the received signal to reconstruct the discrete Fourier transform X(k) of the transmitted signal; and
   reconstructing the sampled analog signal by forming an inverse discrete Fourier transform from X(k).

8. The method as claimed in claim 7 wherein said increased-redundancy signal is received in frames of s samples, where s is an integer factor of the block length N and M is greater than or equal to s.

9. The method as claimed in claim 8 wherein M is an integer multiple of s.

10. The method as claimed in claim 7 including the step of calculating a set of coefficients $h_t$ of an error locator polynomial H(z) from the positions $i_m$ of the lost samples in the block and wherein the step of recursively calculating the error signal uses the coefficients $h_t$.

11. The method as claimed in claim 10 wherein said increased-redundancy signal is received in frames of s samples, where s is an integer factor of the block length N and M is greater than or equal to s.

12. The method as claimed in claim 11 wherein M is an integer multiple of s.

13. The method as claimed in claim 10 wherein the step of recursively calculating the error signal uses the recurrence relation:

$$E(p(r)) = -\frac{1}{h_0}\sum_{t=1}^{v} h_t E(p(r+t))$$

where v is the number of lost samples.

14. The method as claimed in claim 13 wherein said increased-redundancy signal is received in frames of s samples, where s is an integer factor of the block length N and M is greater than or equal to s.

15. The method as claimed in claim 14 wherein M is an integer multiple of s.

16. The method as claimed in claim 10 where the step of forming the discrete Fourier transform of the received signal is followed by a permutation of the coefficients according to p(k), the step of forming the inverse Fourier transform is preceded by a permutation of the coefficients inverse to p(k), and the step of recursively calculating the error signal uses the recurrence relation:

$$E(r) = -\frac{1}{h_0}\sum_{t=1}^{v} h_t E(r+t)$$

where v is the number of lost samples.

17. The method as claimed in claim 16 wherein said increased-redundancy signal is received in frames of s samples, where s is an integer factor of the block length N and M is greater than or equal to s.

18. The method as claimed in claim 17 wherein M is an integer multiple of s.

19. An apparatus for introducing increased redundancy into a discrete signal for the purpose of error concealment or correction of bursty and/or frame losses comprising:
   means for forming the discrete Fourier transform of a block of samples of said signal;
   means for modifying said Fourier transform to form a block of coefficients of block length N in which a predetermined set of M Fourier coefficients are equal to zero; and
   means for forming the inverse discrete Fourier transform of said block of Fourier coefficients to form the increased-redundancy signal;
   CHARACTERISED IN THAT
   said predetermined set of Fourier coefficients consists of the coefficients numbered p(k) where k takes on M successive integer values, p(k) being defined as p(k)=pk mod N where p is a positive integer, greater than unity, relatively prime to N.

20. The apparatus as claimed in claim 19 further including means for transmitting said increased-redundancy signal in frames of s samples, where s is an integer factor of the block length N and M is greater than or equal to s.

21. An apparatus for error concealment or correction of a sampled analog signal comprising:

means for receiving a signal in which some samples have not been correctly received; and means for recovering a signal from the received signal by using redundancy introduced into the transmitted signal, said redundancy consisting of a predetermined set of M Fourier components in each block of the discrete Fourier transform of the transmitted signal of block length N being equal to zero;

CHARACTERISED IN THAT said predetermined set of Fourier coefficients consists of the coefficients numbered p(k) where k takes on M successive integer values, p(k) being defined as p(k)=pk mod N where p is a positive integer, greater than unity, relatively prime to N.

22. The apparatus as claimed in claim 21 further comprising:

means for forming the discrete Fourier transform D(k) of a block of N samples of the received signal d(i);

means for using D(k) to recursively calculate an error signal E(k);

means for using the error signal E(k) and the discrete Fourier transform D(k) of the received signal to reconstruct the discrete Fourier transform X(k) of the transmitted signal; and means for reconstructing the sampled analog signal by forming an inverse discrete Fourier transform from X(k).

23. The apparatus as claimed in claim 22 including means for calculating a set of coefficients $h_t$ of an error locator polynomial H(z) from the positions $i_m$ of the lost samples in the block and wherein the means for recursively calculating the error signal uses the coefficients $h_t$.

24. The apparatus as claimed in claim 23 wherein the means for recursively calculating the error signal uses the recurrence relation:

$$E(p(r)) = -\frac{1}{h_0} \sum_{t=1}^{v} h_t E(p(r+t))$$

where v is the number of lost samples.

25. The apparatus as claimed in claim 23 where the means for forming the discrete Fourier transform of the received signal is followed by means for performing a permutation of the coefficients according to p(k), the means for forming the inverse Fourier transform is preceded by means for performing a permutation of the coefficients inverse to p(k), and the means for recursively calculating the error signal uses the recurrence relation:

$$E(r) = -\frac{1}{h_0} \sum_{t=1}^{v} h_t E(r+t)$$

where v is the number of lost samples.

* * * * *